US008203365B2

(12) United States Patent
Valentino et al.

(10) Patent No.: US 8,203,365 B2
(45) Date of Patent: Jun. 19, 2012

(54) CIRCUIT FOR COMPARING AN INPUT CURRENT WITH A THRESHOLD CURRENT

(75) Inventors: Gianluca Valentino, Cornaredo (IT); Luigino D'Alessio, Abbiategrasso (IT); Giancarlo Candela, Milan (IT)

(73) Assignee: STMicroelectronics S.R.L., Agrate Brianza (MI) (IT)

( * ) Notice: Subject to any disclaimer, the term of this patent is extended or adjusted under 35 U.S.C. 154(b) by 168 days.

(21) Appl. No.: 12/562,278

(22) Filed: Sep. 18, 2009

(65) Prior Publication Data

US 2010/0073034 A1    Mar. 25, 2010

(30) Foreign Application Priority Data

Sep. 19, 2008 (IT) .............................. VA2008A0048

(51) Int. Cl.
*H03K 5/153* (2006.01)
(52) U.S. Cl. ............ 327/77; 327/50; 327/427; 327/434; 361/90; 361/93.9
(58) Field of Classification Search ................. 327/50, 327/51, 72, 77–88, 427, 430, 434–437; 361/90, 361/91.1, 93.9
See application file for complete search history.

(56) References Cited

U.S. PATENT DOCUMENTS

| 5,079,456 A | 1/1992 | Kotowski et al. | ............. 307/571 |
|---|---|---|---|
| 6,054,893 A * | 4/2000 | Singh | ............................. 327/525 |

FOREIGN PATENT DOCUMENTS

EP    1298801    4/2003

OTHER PUBLICATIONS

Dake et al., "A Precision High-Voltage Current Sensing Circuit", IEEE Transactions on Circuits and Systems I, IEEE vol. 55, No. 5, Jun. 1, 2008, pp. 1197-1202.
Ng et al., "Analysis of Lossless Current Sensing Techniques with High Accuracy and Linearity", International Conference on Communications, Circuits and Systems, IEEE, Jul. 11, 2007, pp. 1021-1024.

* cited by examiner

*Primary Examiner* — Lincoln Donovan
*Assistant Examiner* — Shikha Goyal
(74) *Attorney, Agent, or Firm* — Allen, Dyer, Doppelt, Milbrath & Gilchrist, P.A.

(57) ABSTRACT

A circuit is for generating a signal that indicates whether or not an input current exceeds a pre-established threshold current and, in the affirmative case, that is representative of the difference between the input current and the threshold current. The circuit includes a diode-connected transistor biased with a first constant current in a saturation functioning condition, a sense transistor mirrored to the diode-connected transistor and biased in a linear (triode) functioning condition, a load transistor connected in series to the sense transistor, biased with a second constant current and the control terminal of which is connected in common with the respective terminals of the diode-connected transistor and of the sense transistor. The input current to be compared is injected to a common current node of the load transistor and of the sense transistor, and the output voltage is available on the other current node of the load transistor.

18 Claims, 20 Drawing Sheets

CIRCUIT FOR COMPARING AN INPUT CURRENT WITH A THRESHOLD CURRENT

FIELD OF THE INVENTION

This invention relates in general to electronic components, and in particular to power management integrated circuits in which it is helpful to determine whether or not a current flowing through a power switch exceeds a certain threshold and, in the affirmative case, to generate a signal representative of the difference between the current and the threshold.

BACKGROUND OF THE INVENTION

In many applications it is desirable to monitor the current flowing in an electronic component, and to compare it with a reference value to determine whether or not the electronic component is working in an overcurrent condition.

Most power management circuits such as AC-DC converters, DC-DC converters, battery management circuits, linear regulators and the like usually have internal overcurrent protection/detection circuits. Also motor driver circuits usually have internal overcurrent protection/detection circuits to prevent damage and/or malfunction.

Commonly, a voltage representative of the current flowing in an output electronic component or in a load (such as motors, batteries, converters load) is produced on a series sense resistor Rsense, as illustrated in FIGS. 1 and 2. Of course, the use of a resistor increases the power dissipation and decreases the overall system efficiency. Moreover, monitoring circuits for reading the voltage drop on the sense resistor need dedicated pins.

To reduce disadvantages, the architecture of FIG. 3 is often used. The power transistor supplying the current to the load is coupled with a scaled replica thereof (SenseFet) connected in parallel to the power transistor. Therefore, the current through the sense transistor SenseFet is a scaled replica of the current flowing through the power transistor PowerFet.

The replica current Isense may be compared with a reference current $I_{REF}$ to determine whether or not the power transistor is in an overcurrent condition. The circuit for comparing the replica current should not alter the bias condition of the transistor SenseFet with respect to that of the transistor PowerFet, otherwise the sensed replica current Isense may not be proportional to the current Ipower flowing through the Power Fet.

A typical way to ensure this is to use the architecture illustrated in FIG. 4, comprising a voltage comparator for comparing the voltage drop on a sense resistor in series to the SenseFet with a threshold $V(I_{REF})$.

With this architecture, the result of the comparison is affected by fluctuations of the sense resistor, fluctuations of the $V(I_{REF})$, comparator offset, and PowerFet-SenseFet mismatch.

Some of these variations can be compensated, for example, by obtaining the threshold $V(I_{REF})$ with a voltage drop on a resistor of the same type of the one used as current sense resistor, as shown in FIG. 5. However, the result of the comparison remains affected by sense resistor—reference resistor mismatch, comparator offset, and PowerFet-SenseFet mismatch.

SUMMARY OF THE INVENTION

A circuit has been devised for generating a signal that indicates whether or not an input current exceeds a pre-established threshold current and, in the affirmative case, that is representative of the difference between the input current and the threshold current. The circuit disclosed herein has a simple architecture, occupies a reduced silicon area, and its functioning is relatively insensitive to temperature variations and to fluctuations of the bias current.

The circuit comprises a diode-connected transistor biased with a first constant current in a saturation functioning condition, a sense transistor mirrored to the diode-connected transistor and biased in a linear (triode) functioning condition, a load transistor connected in series to the sense transistor, biased with a second constant current and the control terminal of which is connected in common with the respective terminals of the diode-connected transistor and of the sense transistor. The input current to be compared is injected to a common current node of the load transistor and of the sense transistor, and the output voltage is available on the other current node of the load transistor.

When the input current drops below a certain pre-established threshold, the output voltage drops abruptly to 0. When the input current surpasses the threshold, the variations of the output voltage represent the difference between the sensed input current and the pre-established threshold current.

The proposed circuit may be used for realizing a logic current comparator that flags when the threshold current is exceeded, or for generating an analog voltage representative of the variations of the sensed input current when the threshold is exceeded.

In some embodiments, this circuit is made from CMOS components. High Voltage and Low Voltage, High Side and Low Side, P-channel and N-channel Power FET topologies are disclosed herein.

DETAILED DESCRIPTION OF THE PREFERRED EMBODIMENTS

Figure 6:
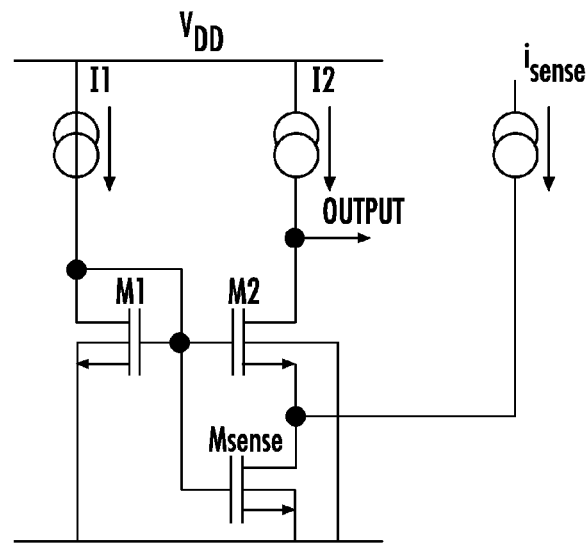
FIG. 6 depicts a basic architecture of the circuit of the present invention.

An exemplary embodiment of the circuit of the present invention is illustrated in FIG. 6. The transistor M1 is biased in a saturation functioning mode, the transistor Msense operates in the so-called triode region (linear region) of its functioning characteristic, and the gate-source voltage Vgs2 at which the transistor M2 enters in a saturation functioning mode is a design parameter. The equations that describe the functioning of the transistors in the saturation region (Eq. 1a) and in the linear functioning region (Eq. 1b) are:

Saturation $$I = \frac{1}{2} \cdot \mu \cdot Cox \cdot \frac{W}{L} \cdot (Vgs - Vt)^2 \text{ or} \quad (1a)$$

$$I = \frac{1}{2} \cdot K \cdot \frac{W}{L} \cdot (Vgs - Vt)^2$$

where $K = \mu \cdot Cox$.

Linear region $$I = \mu \cdot Cox \cdot \frac{W}{L} \cdot Vds \cdot \left[(Vgs - Vt) - \frac{1}{2} \cdot Vds\right] \text{ or}$$

$$I = K \cdot \frac{W}{L} \cdot Vds \cdot \left[(Vgs - Vt) - \frac{1}{2} \cdot Vds\right]$$

being K=μ·Cox. If Vds is much smaller than Vgs−Vt $$I \approx K \cdot \frac{W}{L} \cdot Vds \cdot (Vgs - Vt) \quad (1b)$$

wherein:
Vgs is the gate-source voltage;
Vds is the drain-source voltage;
Vt is the Volt-equivalent of temperature;
W/L is the aspect ratio of the transistor; and
K is a process parameter.

In the above equations, second order effects (channel length modulation effect and body effect) have been neglected. The transistor M2 is biased such to enter the saturation region when the current Isense attains a desired threshold current $I_{TH}$. The equations that describe the functioning of the circuit of FIG. 6, when the current Isense has attained the threshold current, are:

$$I1 = \frac{1}{2} \cdot K \cdot \left(\frac{W}{L}\right)_1 \cdot (Vgs1 - Vt)^2 \quad (2)$$

$$I2 = \frac{1}{2} \cdot K \cdot \left(\frac{W}{L}\right)_2 \cdot (Vgs2 - Vt)^2 = \frac{1}{2} \cdot K \cdot N \cdot \left(\frac{W}{L}\right)_1 \cdot (Vgs2 - Vt)^2 \quad (3)$$

having supposed that the aspect ratio of M2 is N times larger than the aspect ratio of M1, i.e.

$$\left(\frac{W}{L}\right)_2 = N \cdot \left(\frac{W}{L}\right)_1$$

and $Isense + I2 \approx K \cdot \left(\frac{W}{L}\right)_{sense} \cdot Vds_{sense} \cdot (Vgs_{sense} - Vt)$ Supposing that Isense>>I2 in the variation range of interest of Isense and considering that Vgs1=Vgs$_{sense}$, $$Isense \approx K \cdot \left(\frac{W}{L}\right)_{sense} \cdot Vds_{sense} \cdot (Vgs1 - Vt) \quad (4)$$

The threshold current $I_{TH}$=Isense is the current that solves equations (2), (3) and (4). Considering that the drain-source voltage Vds$_{sense}$ of the transistor Msense is equal to Vgs1−Vgs2:

$$\begin{cases} I1 = \frac{1}{2} \cdot K \cdot \left(\frac{W}{L}\right)_1 \cdot (Vgs1 - Vt)^2 \\ I2 = \frac{1}{2} \cdot K \cdot N \cdot \left(\frac{W}{L}\right)_1 \cdot (Vgs2 - Vt)^2 \\ I_{TH} \approx K \cdot \left(\frac{W}{L}\right)_{sense} \cdot (Vgs1 - Vgs2) \cdot (Vgs1 - Vt) \end{cases} \quad (5)$$

Being $I1 = M \cdot I2; \left(\frac{W}{L}\right)_{sense} = P \cdot \left(\frac{W}{L}\right)_1$ wherein M is the ratio between the bias currents I1 and I2 and P is the ratio between the aspect ratios of Msense and M1, the threshold current $I_{TH}$ beyond which the comparator of this disclosure generates an active flag is:

$$I_{TH} \approx 2 \cdot I1 \cdot P \cdot \left(1 - \frac{1}{\sqrt{N \cdot M}}\right) \quad (6)$$

The above equation shows that the threshold current $I_{TH}$ is a function of the bias current I1 and of certain CMOS geometrical ratios (P, N, M), that can be accurately determined with modern fabrication technologies. The more accurately the bias current I1 and the geometrical ratios P, N and M are determined, the more accurately the threshold current will be fixed.

Figure 7:
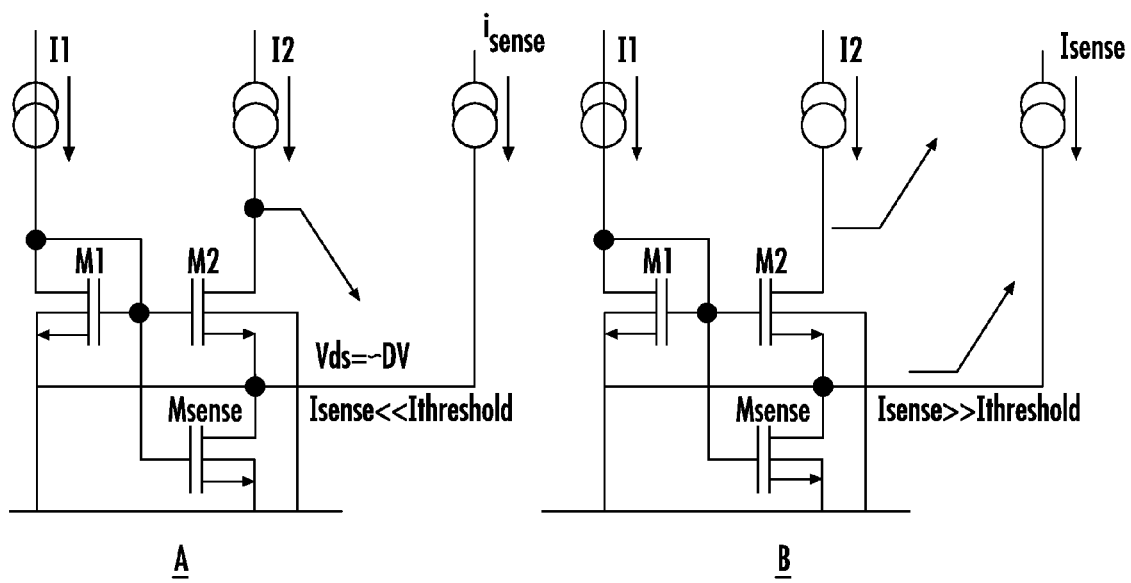
FIG. 7 illustrates the functioning of the circuit of the present invention in two different working conditions.

In order to better understand the functioning of the proposed circuit when the sensed current Isense varies, reference is made to FIG. 7 that depicts the circuit of FIG. 6 in two different functioning conditions. When the current Isense being monitored is lower than the threshold current (FIG. 7a), the transistor M2 is working in its linear functioning region. Therefore, its drain-source voltage Vds2 is small, its gate-source voltage Vgs2 is almost equal to the gate-source voltage Vgs1 of the transistor M1, and thus the drain-source voltage Vds of the transistor Msense is substantially null. Therefore, the voltage $V_{OUTPUT}$ on the node OUTPUT, that is the sum of the drain-source voltages Vds2 of the transistor M2 and $Vds_{sense}$ of the transistor Msense, respectively, may be relatively small.

When the current Isense being monitored attains the threshold current $I_{TH}$, the drain-source voltage $Vds_{sense}$ of the transistor Msense is comparable with the gate-source voltage Vgs1 of the transistor M1, hence the gate-source voltage Vgs2 of the transistor M2 is small, the transistor M2 enters a saturation functioning condition, its drain-source voltage Vds2 is relevant and thus the voltage $V_{OUTPUT}$ is relatively large.

If the current Isense being monitored tends to surpass the pre-established threshold current $I_{TH}$, the drain-source voltage $Vds_{sense}$ of the transistor Msense will tend toward the gate-source voltage Vgs1 of the transistor M1, hence the gate-source voltage Vgs2 of the transistor M2 will tend to decrease. Since M2 is in a saturation condition, even a small reduction of its gate-source voltage Vgs2 causes a relatively large increase of its drain-source voltage Vds2. Therefore, the voltage $V_{OUTPUT}$ on the node OUTPUT will tend to increase abruptly.

By resuming, if the voltage $V_{OUTPUT}$ is small, it can be interpreted as a low logic value flagging that the sensed current is smaller than the threshold $I_{TH}$. If the voltage $V_{OUTPUT}$ is large, it can be interpreted as a high logic value flagging that the sensed current has attained or surpassed the threshold current $I_{TH}$. In addition, if the sensed current Isense tends to exceed the threshold current $I_{TH}$, the voltage $V_{OUTPUT}$ tends to increase rapidly. Therefore, the difference $V\epsilon$ between the voltage $V_{OUTPUT}$ and its value corresponding to the functioning condition in which the sensed current Isense equals the threshold current $I_{TH}$, represents with good accuracy eventual variations of the sensed current Isense above the threshold $I_{TH}$.

The transistor $M_{SENSE}$ is in its linear functioning region, thus it is used as a resistor, though it may not be substituted with a resistor or a diode-connected transistor without degrading the performances of the circuit in term of precision by which the threshold current is fixed. If the MOSFET $M_{SENSE}$ in FIG. 6 was replaced by a resistor $R_{SENSE}$, as depicted in the book "Smart Power ICs: Technologies and Applications", Springer series in Advanced Microelectronics, by Bruno Murari, Franco Bertotti and Giovanni A. Vignola, the following formula for the threshold current would be obtained:

$$I_{TH} \approx \frac{1}{R_{SENSE}} \cdot \sqrt{\frac{2I_1}{\mu_n C_{ox}\left(\frac{W}{L}\right)_1}} \cdot \left(1 - \frac{1}{\sqrt{N \cdot M}}\right) \quad (7)$$

By comparing the above formula with equation (6), it can be immediately inferred that, using a resistor $R_{SENSE}$ in place of the transistor $M_{SENSE}$, the spread of the threshold current $I_{TH}$ would depend upon the process spread of the parameter $\mu_N C_{OX}(W/L)_1$ and of the resistance $R_{SENSE}$. For this reason, the spread of the threshold current $I_{TH}$ of the proposed circuit is outstandingly smaller than that obtainable using a resistor $R_{SENSE}$.

It may also not be possible to use a diode-connected transistor in place of the transistor Msense, because diode-connected transistors work in saturation region and thus the voltage drop thereon is relatively large.

By contrast, with the proposed architecture depicted in FIG. 6, the transistor Msense is kept in its linear functioning region, thus its drain-source voltage is negligible, and the threshold current $I_{TH}$ depends on geometrical parameters of the MOSFETs and on the bias current I1, that can be very accurately determined.

Figure 8:
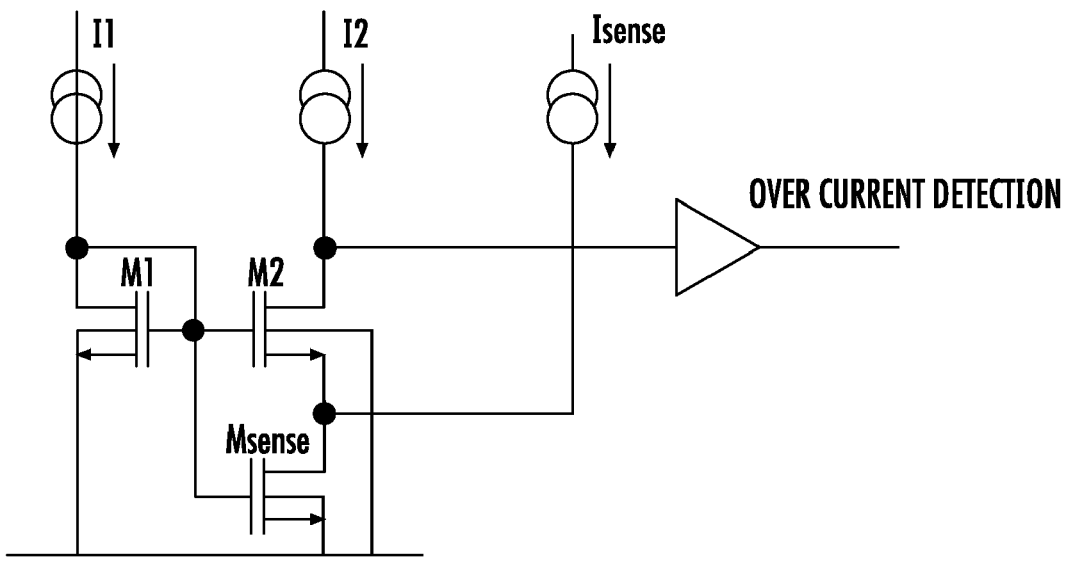
FIG. 8 depicts an embodiment of the proposed logic current comparator of the present invention.

The proposed circuit may be provided with a logic comparator OVERCURRENT DETECTION, as shown in FIG. 8, for generating a flag for signaling the detection of an overcurrent condition. In practice, the logic comparator compares the voltage $V_{OUTPUT}$ with its value corresponding to the condition Isense=$I_{TH}$ and generates an active flag when the threshold $I_{TH}$ is attained or surpassed.

The circuit of FIG. 8 is a logic current comparator that allows a significant reduction of silicon area consumption, compared to the commonly used circuits composed of matched sense resistors and a voltage comparator. The saved silicon area is even larger than the known architecture in which the sense comparator is referred to a high voltage rail when used in High Side topologies.

Figure 9:
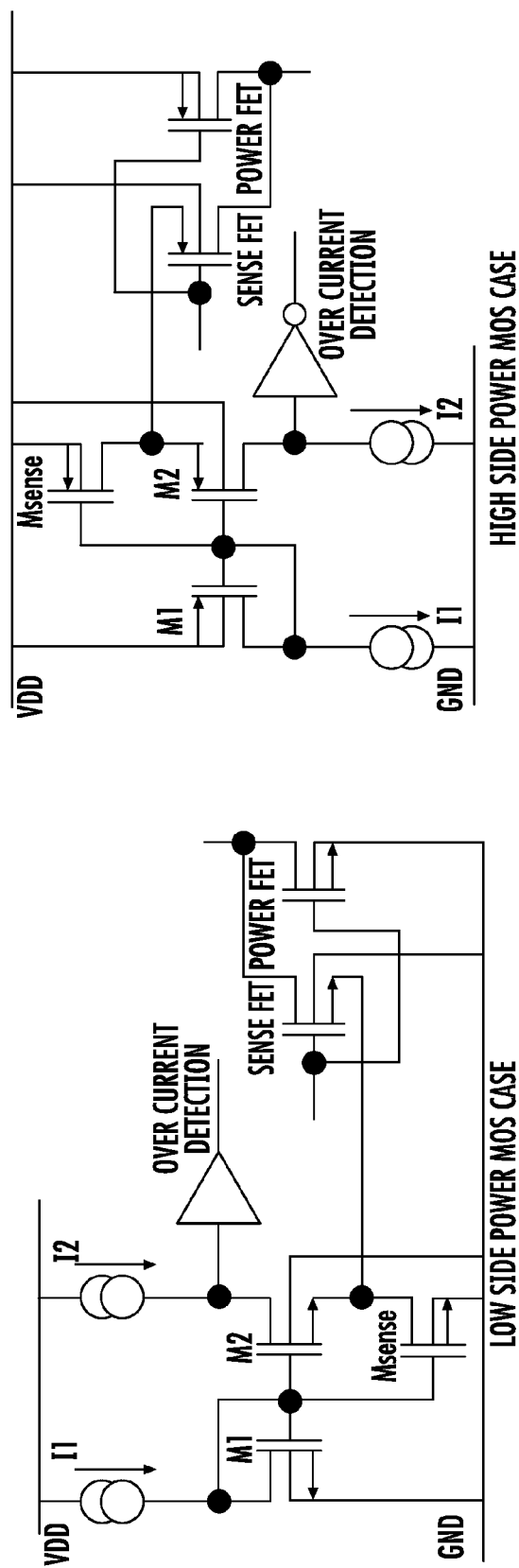
FIG. 9 depicts two Low Voltage CMOS topologies of the comparator of FIG. 8.

Two topologies of the proposed logic current comparator, for a low voltage CMOS fabrication process, connected to a scaled replica SENSEFET of the power transistor POWERFET, the current flowing therethrough is to be monitored, are depicted in FIG. 9.

Figure 10:
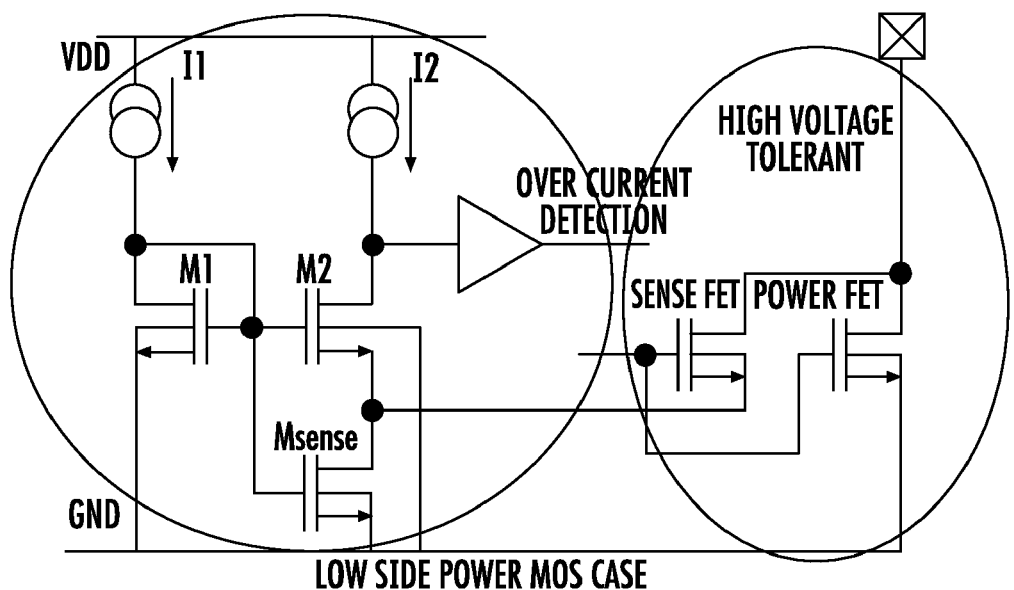
FIG. 10 depicts a Mixed Signal Low Side topology of the comparator of FIG. 8.

In mixed signal technologies, the low side device is usually a N-type component, as exemplified in FIG. 10. In this case the topology of the logic current comparator can be the same as discussed above for a CMOS technology.

Figure 11:
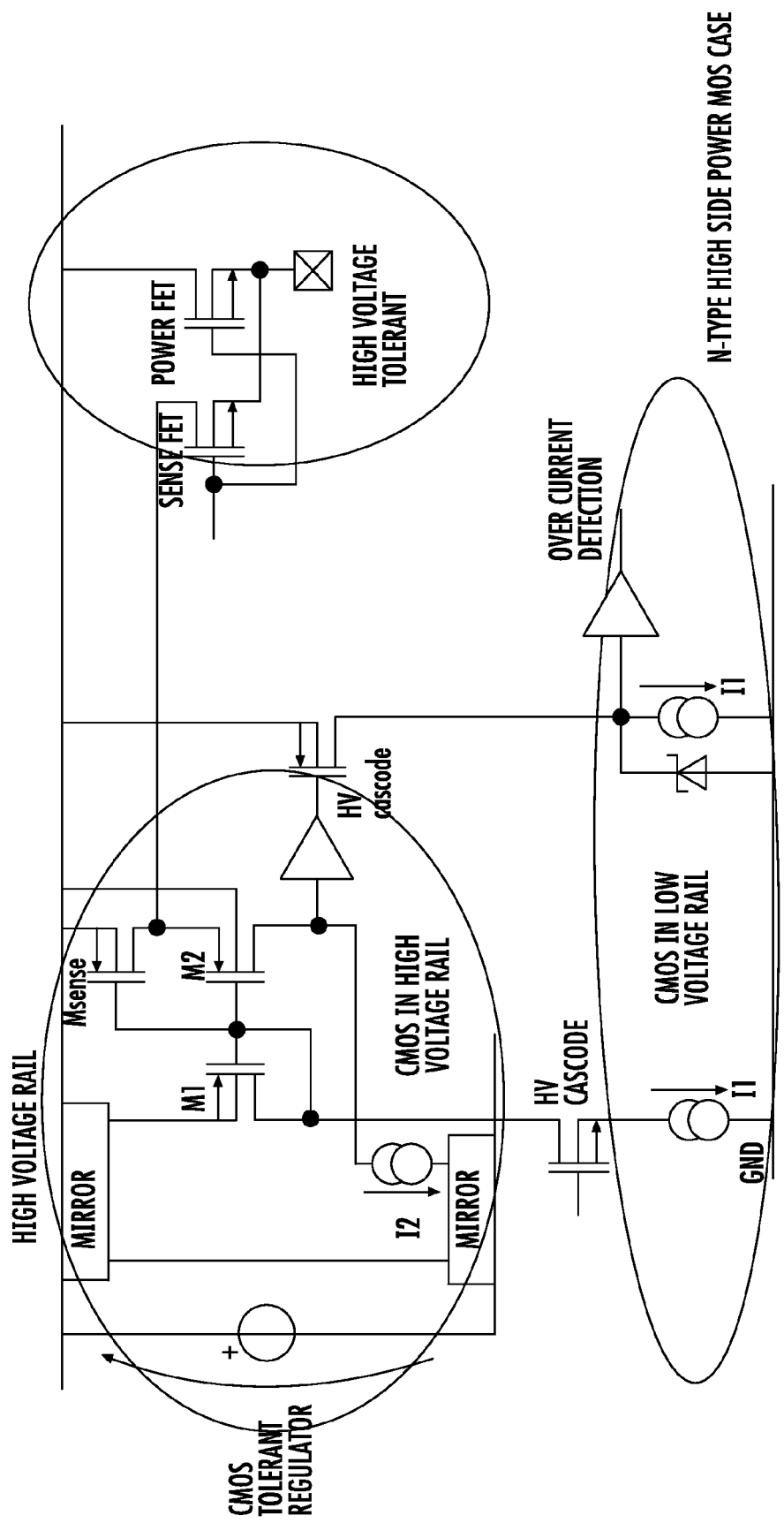
FIG. 11 depicts a Mixed Signal N-type High Side Power MOS topology of the comparator of FIG. 8.
Figure 12:
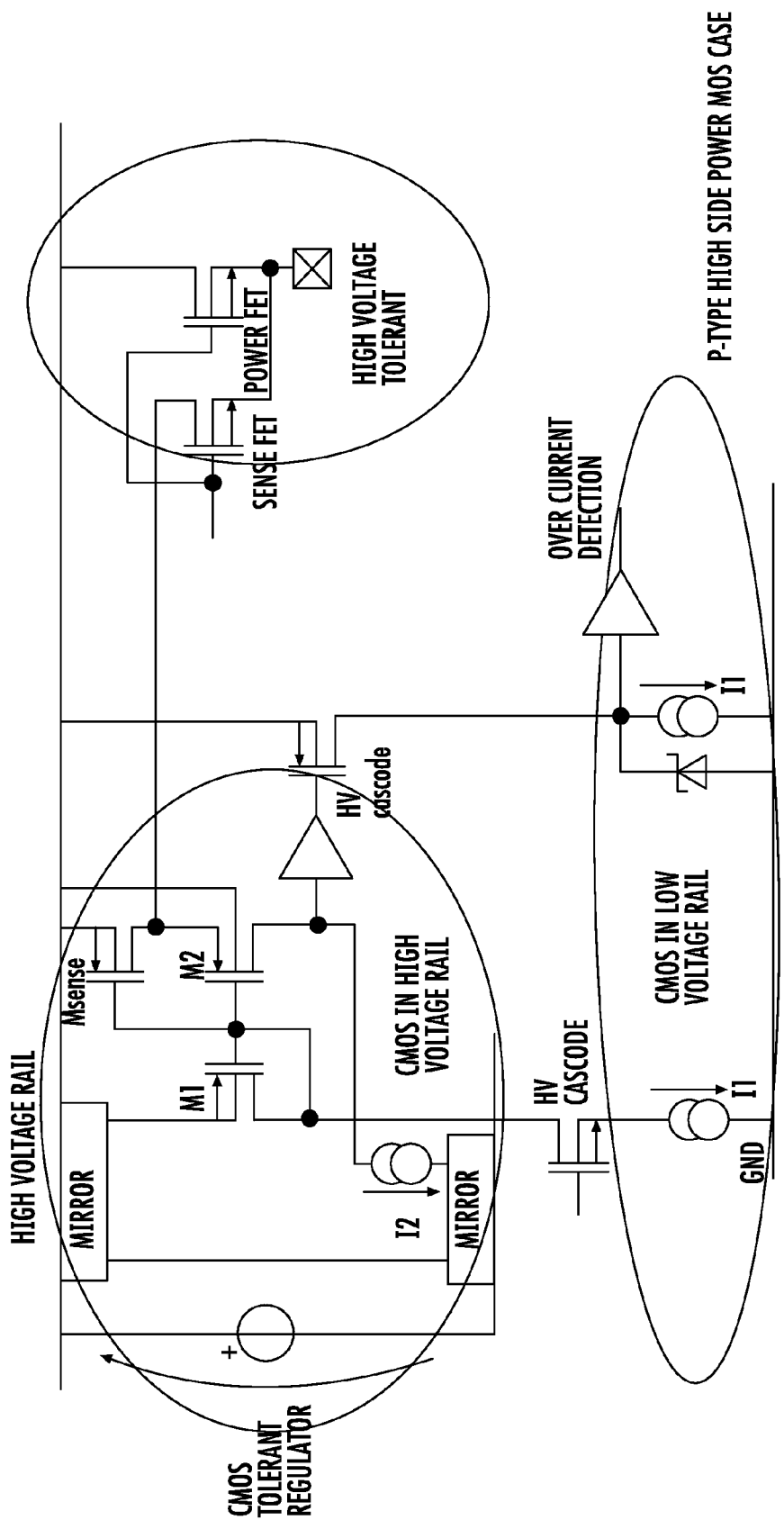
FIG. 12 depicts a Mixed Signal P-type High Side Power MOS topology of the comparator of FIG. 8.

When a high side power switch POWER FET is needed in a mixed signal technology, it may be either an N-type or a P-type component and in this case the topology of the proposed logic current comparator is relatively more complex than as depicted in the exemplary embodiments of FIGS. 11 and 12. Test simulations carried out by the applicant showed that the precision of the proposed circuit depends mainly on the precision with which the bias current I1 is determined.

Figure 13:
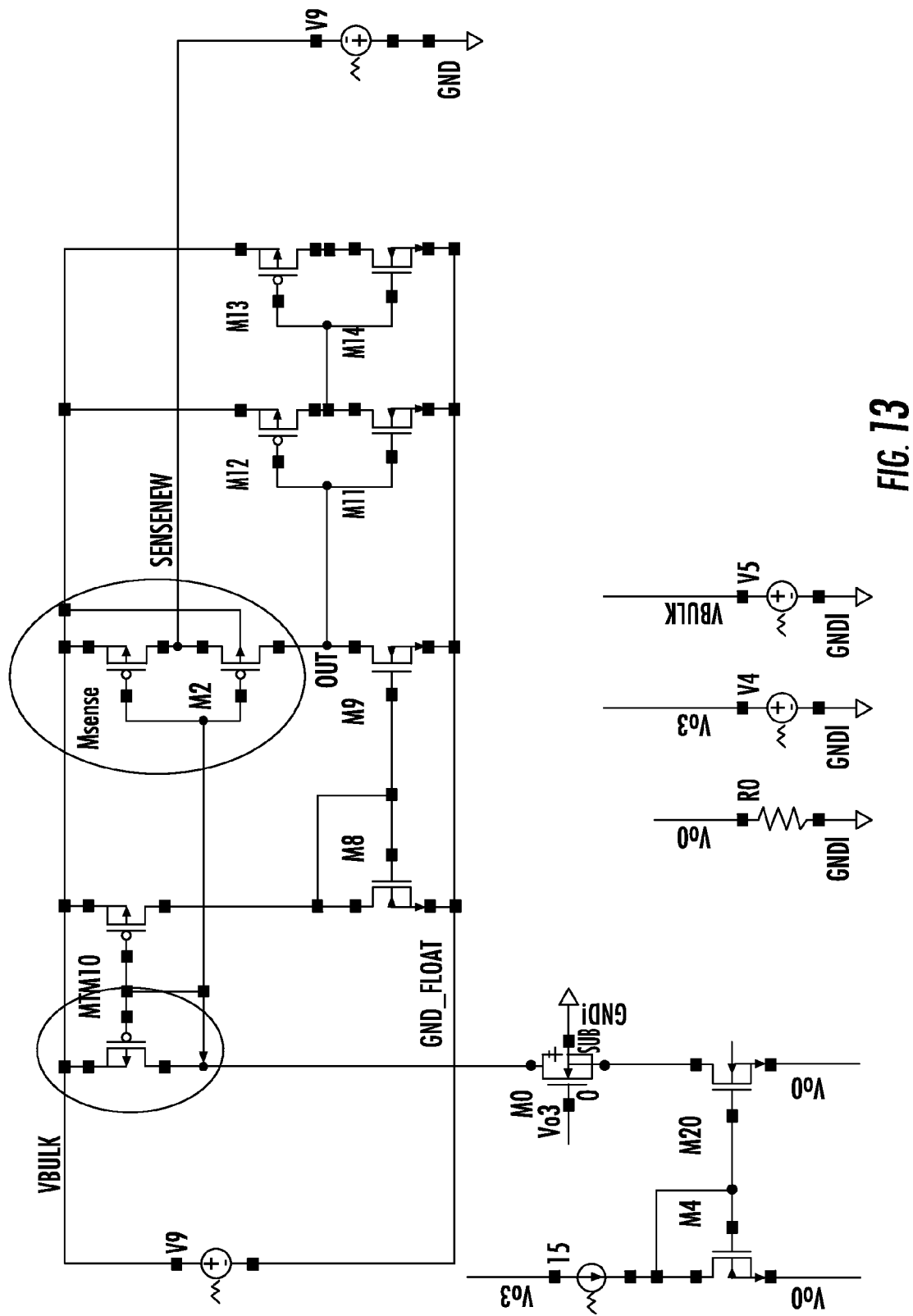
FIG. 13 depicts a test circuit for simulating the functioning of the comparator of FIG. 8.

The simulated circuit is depicted in FIG. 13. The mixed signal high side power MOS topologies of FIGS. 11 and 12 can be easily recognized. The circled MOS components of the simulation circuit of FIG. 13 are the M1-M2-Msense components of the topologies of FIGS. 11 and 12. The simulations were of a MonteCarlo type, with 200 runs for each temperature value (30-80-120 Celsius degrees). The abscissa is the current Isense. The low voltage supply V4 on the line Va3, and the supply V9 referred to the high voltage rail, both have a uniform distribution in a range from 3.15V to 3.45V. The dependence of the voltage VBULK on the threshold current is negligible.

Figure 14:
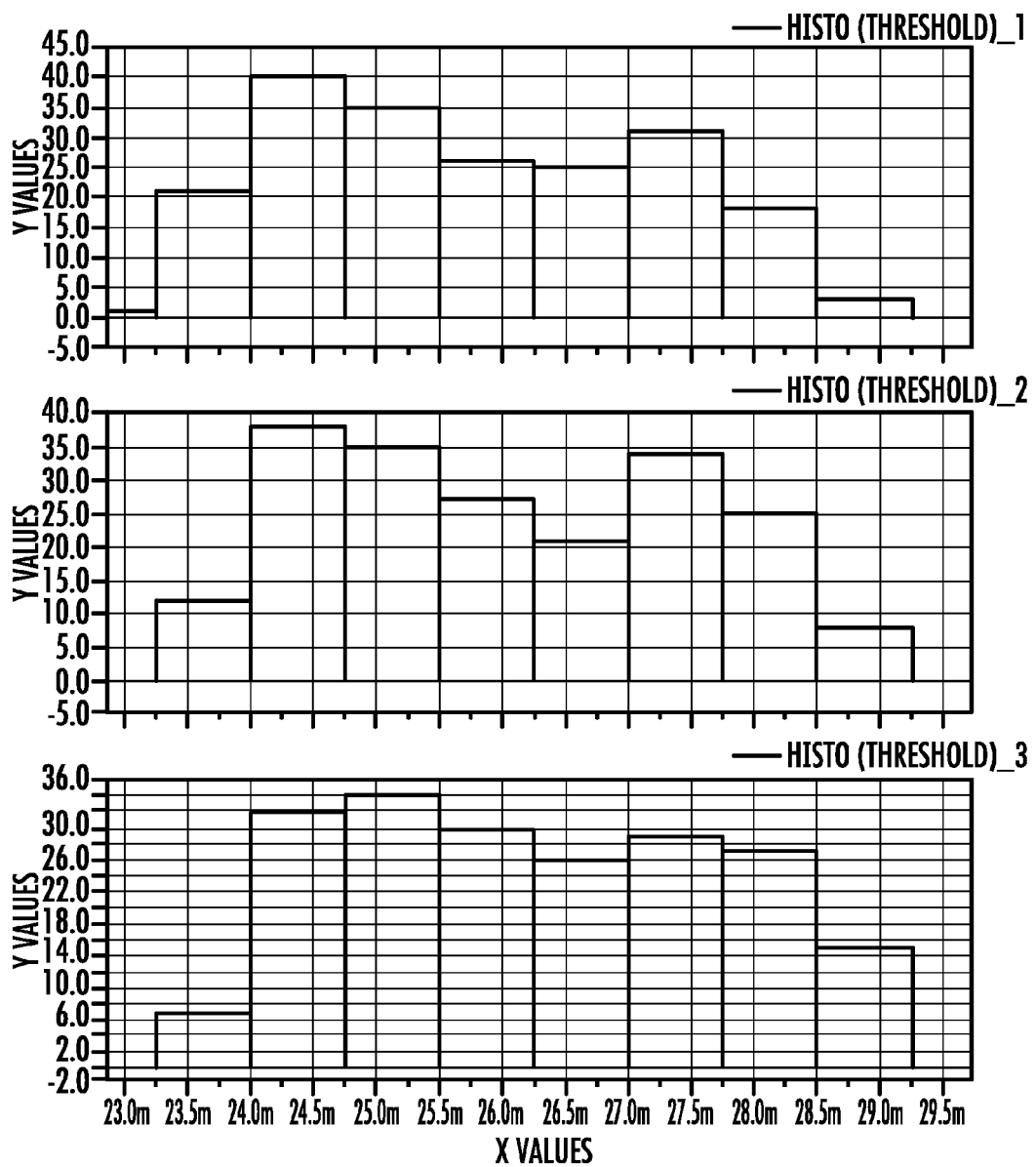
FIG. 14 shows simulation results for bias current fluctuations of ±10% and temperature variations of 30-80-120 Celsius degrees for the circuit of the present invention.

FIG. 14 depicts simulation results with a bias current uniformly distributed in a ±10% range. For all the temperatures, the distribution of the threshold current remains substantially uniform within a variation range of about ±10% (26.3 mA±2.63 mA).

Figure 15:
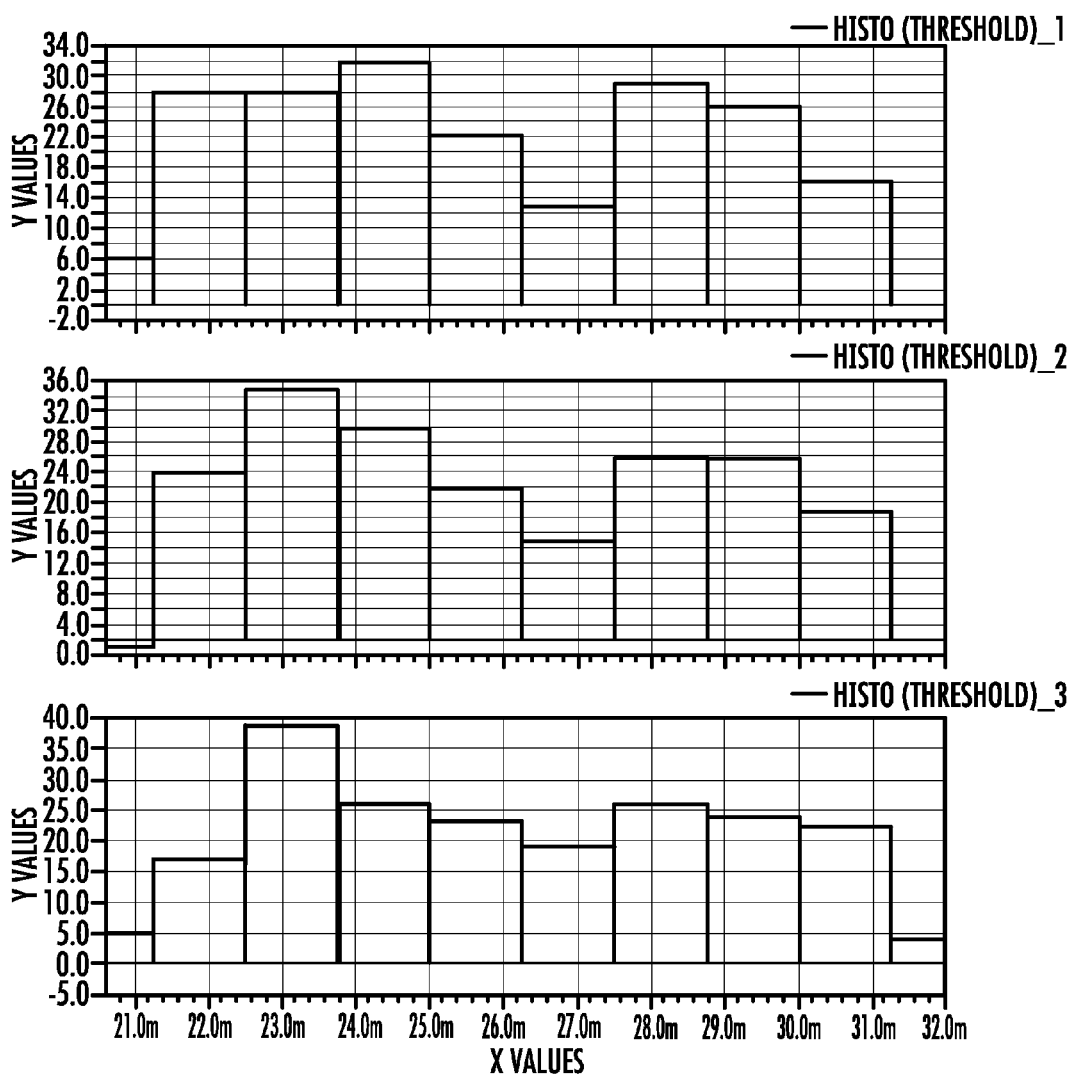
FIG. 15 shows simulation results for bias current fluctuations of ±20% and temperature variations of 30-80-120 Celsius degrees for the circuit of the present invention.

FIG. 15 depicts simulation results with a bias current uniformly distributed in a ±20% range. Even in this case, for the temperatures the distribution of the threshold current remains substantially uniform, within a variation range of about ±20% (26.3 mA±5.3 mA).

Figure 16:
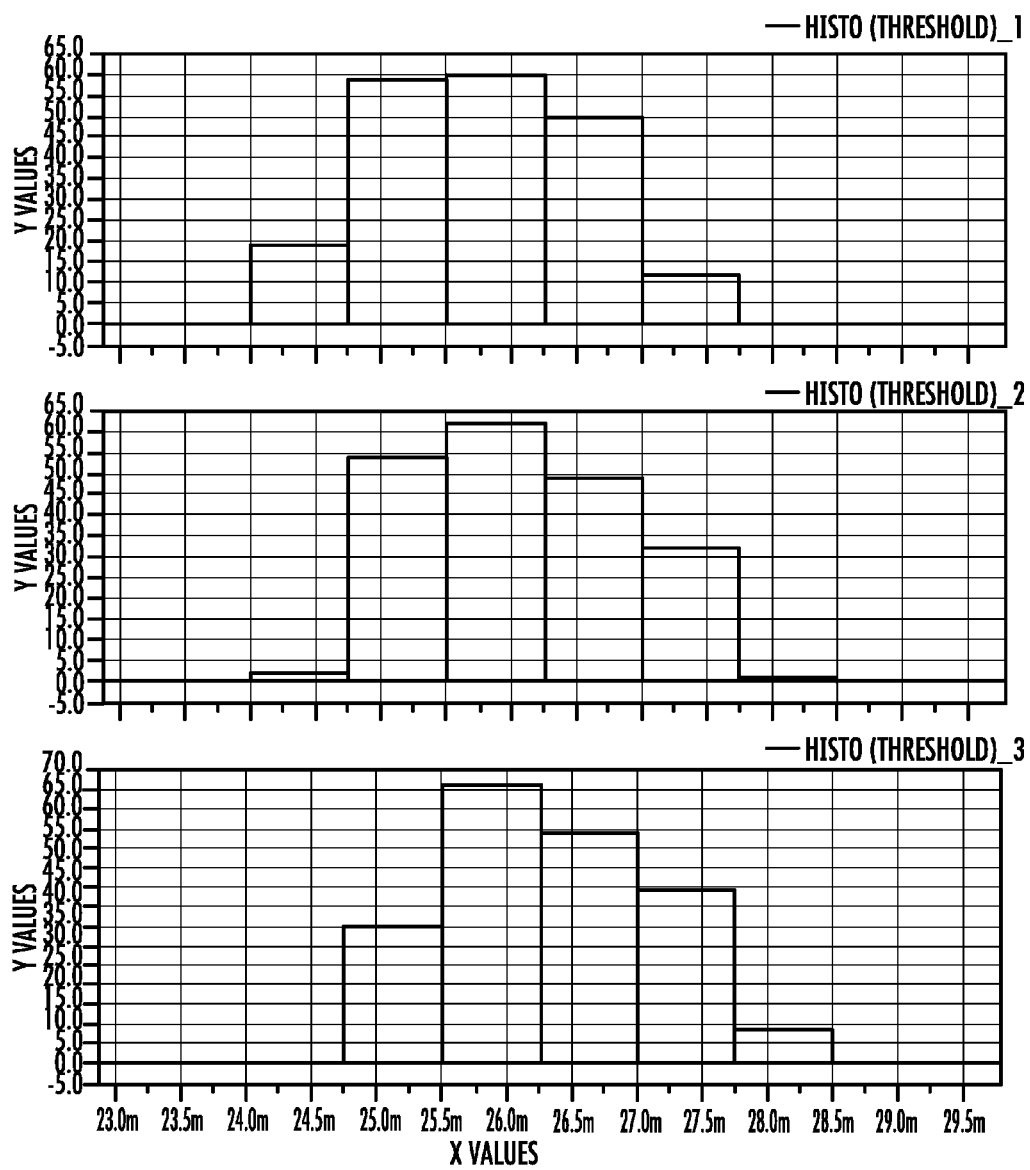
FIG. 16 shows simulation results for bias current fluctuations of ±5% and temperature variations of 30-80-120 Celsius degrees for the circuit of the present invention.
Figure 17:
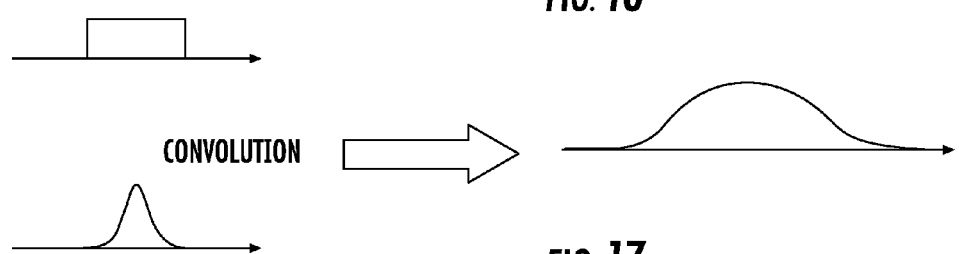
FIG. 17 shows the convolution between a square waveform and a Gaussian pulse for the circuit of the present invention.

FIG. 16 depicts the simulation results with a bias current uniformly distributed in a ±5% variation range. It can be observed that in this case the distribution of the current threshold has a Gaussian-like shape. This could be explained considering that a 5% uniform distribution function has substantially the same width of the typical Gaussian distribution function of the parameters of the matching CMOS components. As schematically shown in FIG. 17, the distribution of the current threshold is approximately the convolution of the uniform distribution of the bias current and of the Gaussian distribution of the parameters of the matching CMOS components. Since in this case the two distributions have substantially the same width, the distribution of the current threshold has a Gaussian-like shape.

Figure 1:
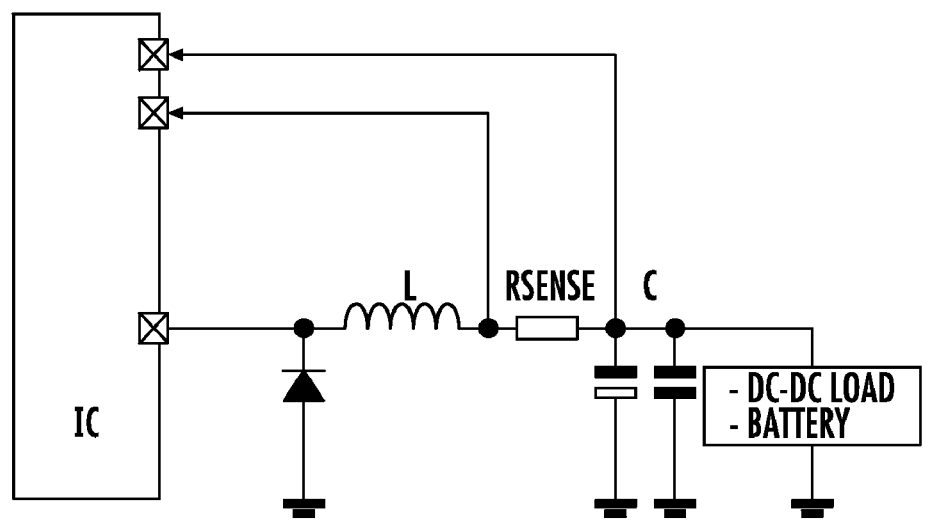
FIG. 1 depicts a common DC-DC Converter/Battery Charger, according to the prior art.
Figure 2:
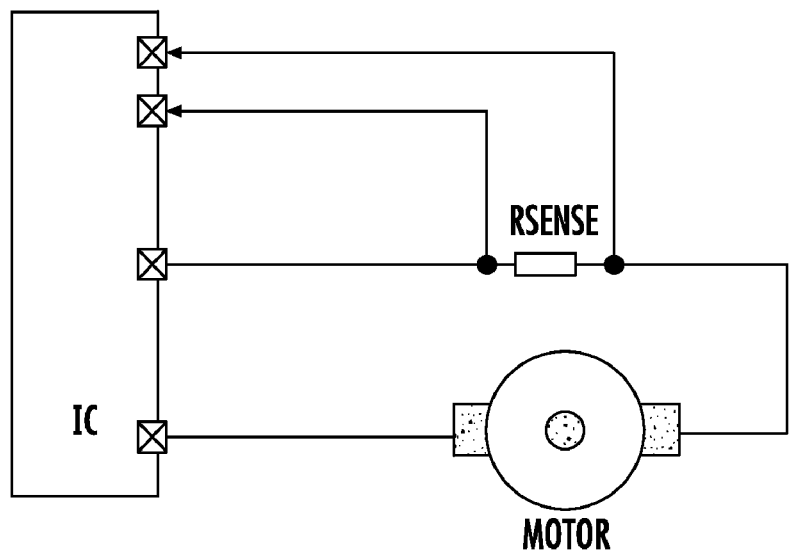
FIG. 2 depicts a common DC Motor driver, according to the prior art.
Figure 3:
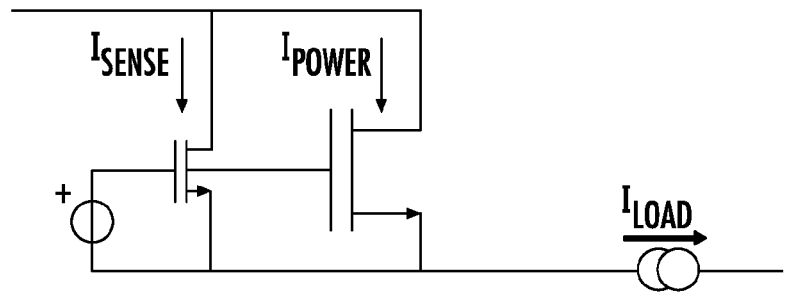
FIG. 3 depicts a sense MOSFET SenseFet coupled to a power MOSFET, according to the prior art.
Figure 4:
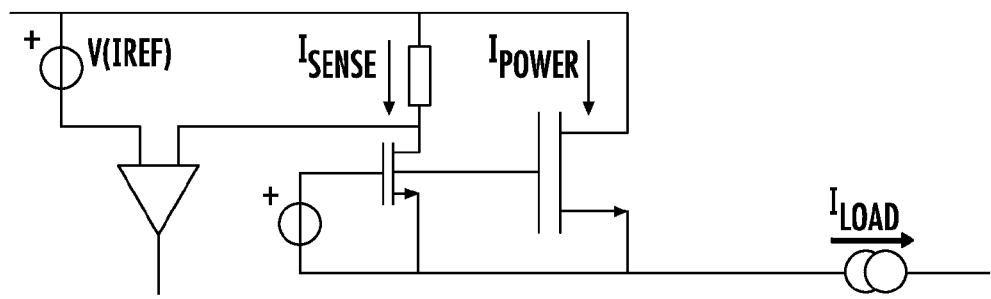
FIG. 4 depicts a common current comparator coupled to a sense MOSFET SenseFet, according to the prior art.
Figure 5:
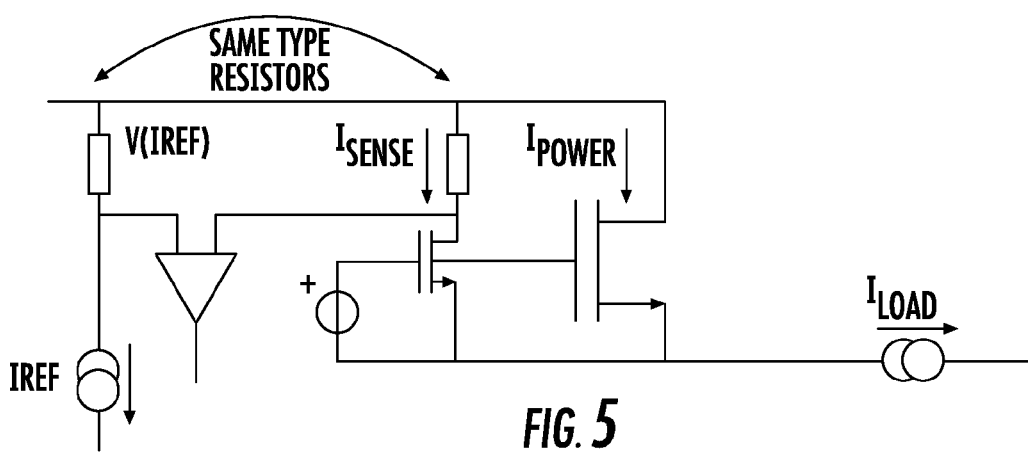
FIG. 5 depicts a common current comparator coupled to a sense MOSFET SenseFet with a reference resistor matched with the sense resistor, according to the prior art.
Figure 18:
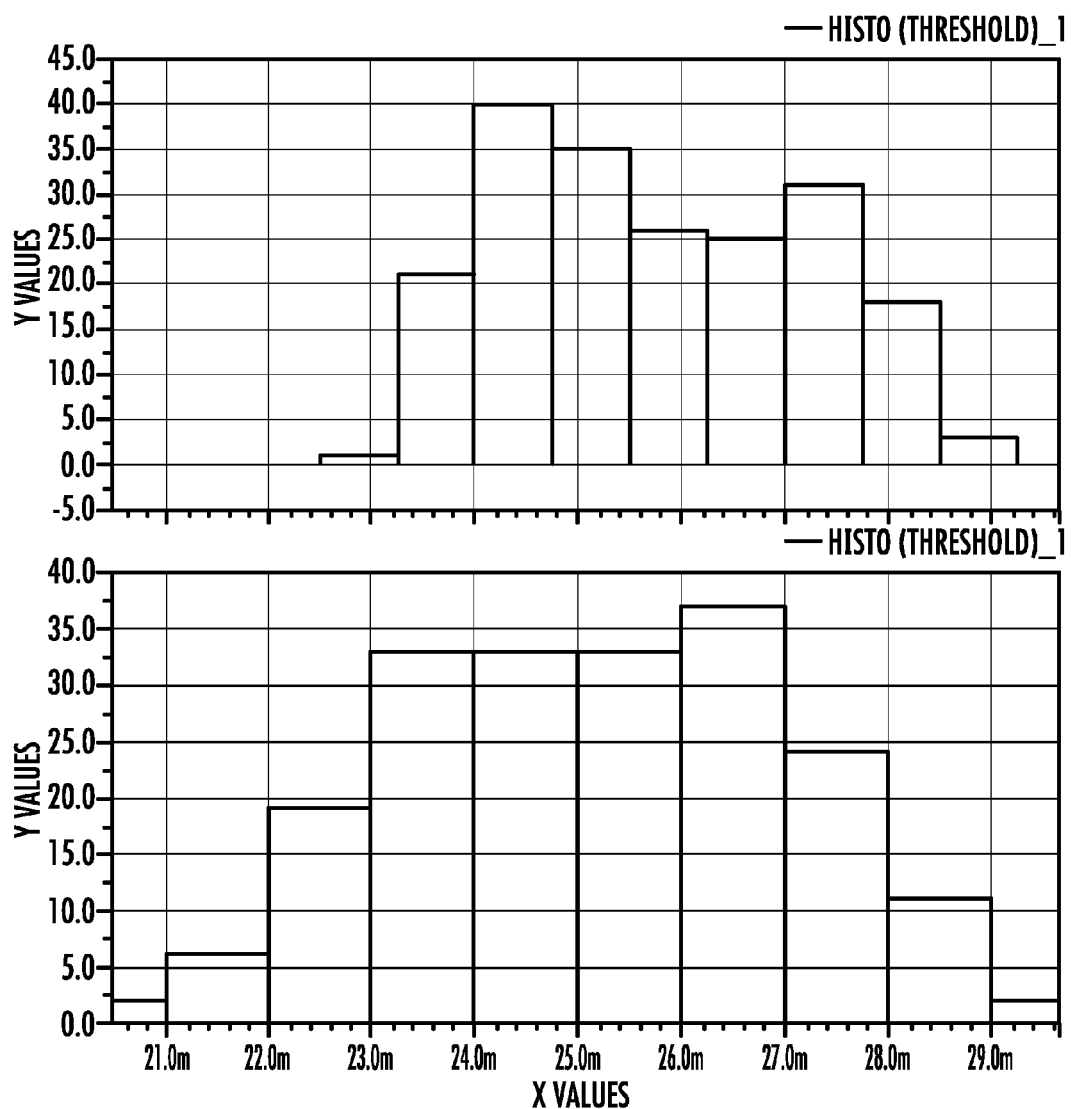
FIG. 18 compares performance of the proposed circuit (upper) and the prior comparator (lower) of FIG. 5 for bias current fluctuations of ±10%.

FIG. 18 compares the functioning of a) the logic current comparator of this invention with b) the commonly known comparator of FIG. 5, for fluctuations of ±10% of the bias current. The simulation shows how the Gaussian distribution spread of the matching CMOS components in the proposed logic comparator negligibly influences the precision with which the threshold $I_{TH}$ is determined. The known comparator of FIG. 5 has a larger number of basic components than the current comparator of this disclosure and its precision is more coarse.

Figure 19:
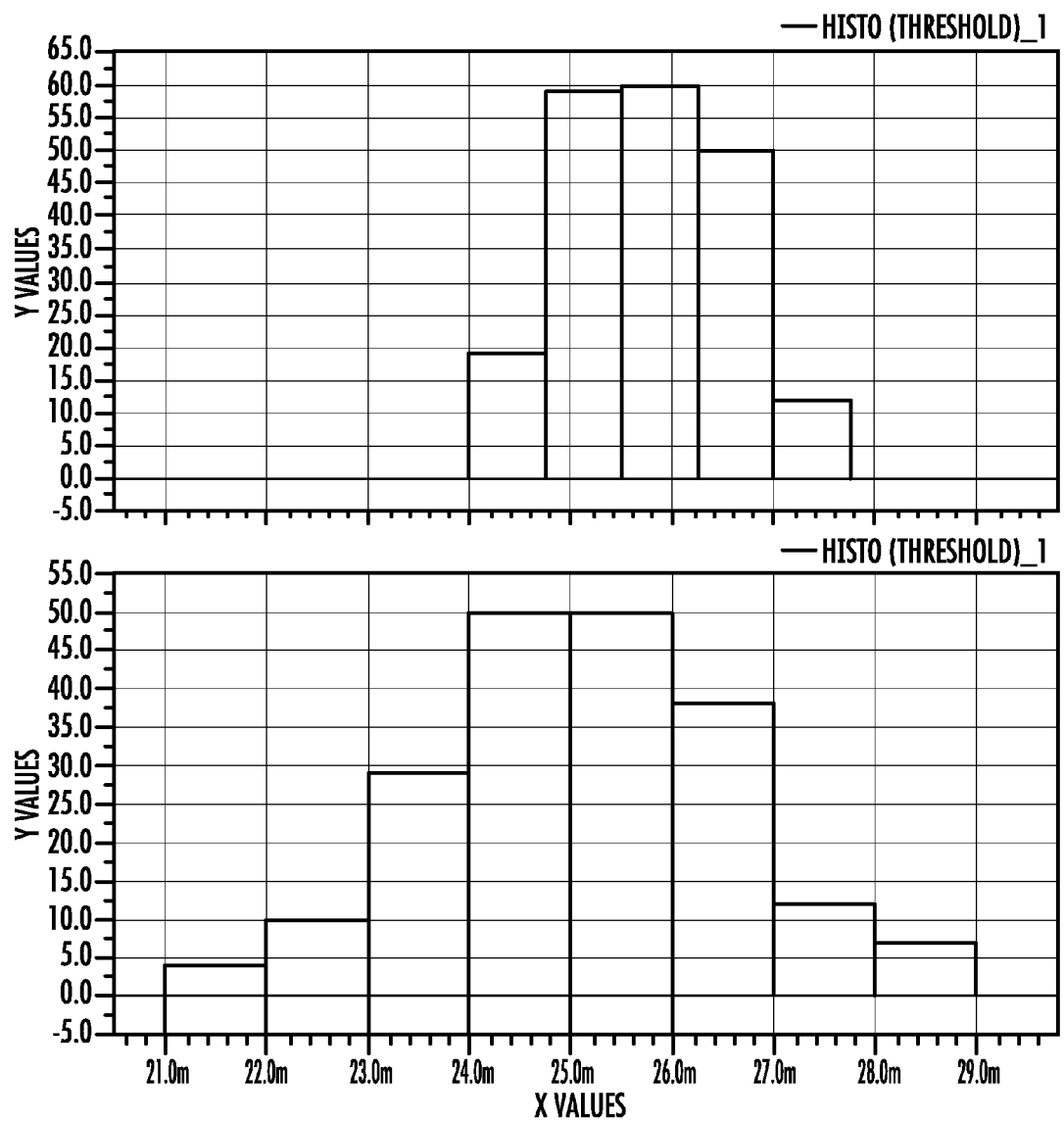
FIG. 19 compares performance of the circuit of the present invention and the prior comparator of FIG. 5 for bias current fluctuations of ±5%.

This fact may be even better inferred from the simulations of FIG. 19, in which a bias current distributed in a ±5% range has been used. In this case, the Gaussian distribution of the matching CMOS components makes the proposed architecture more refined than the prior comparator of FIG. 5.

Figure 20:
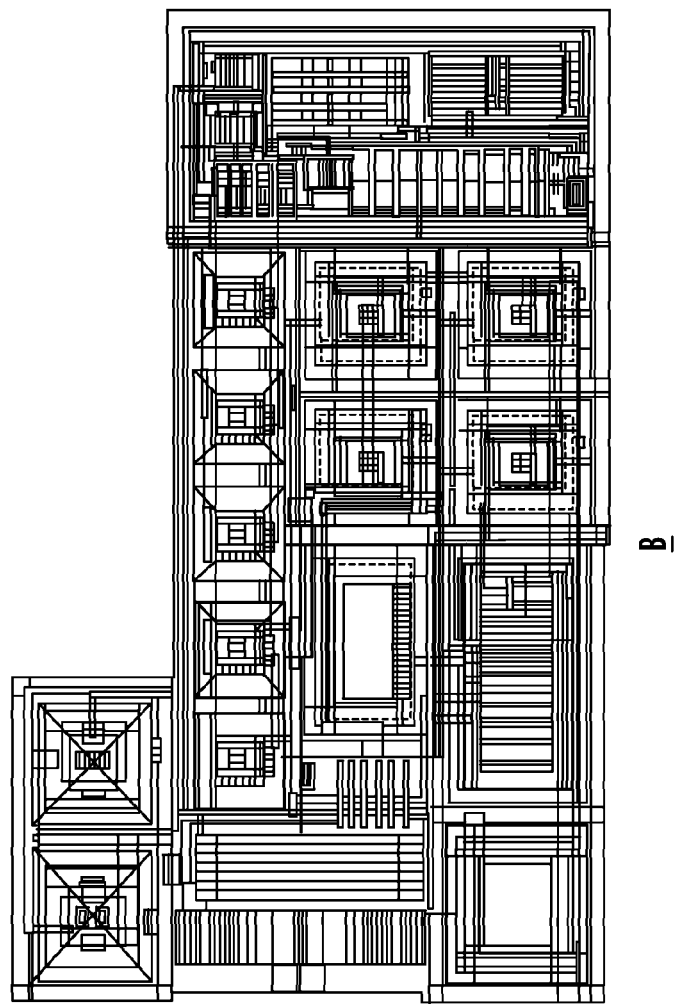
FIG. 20 compares layouts of the logic comparator of the present invention and of the prior comparator of FIG. 5.
Figure 20:
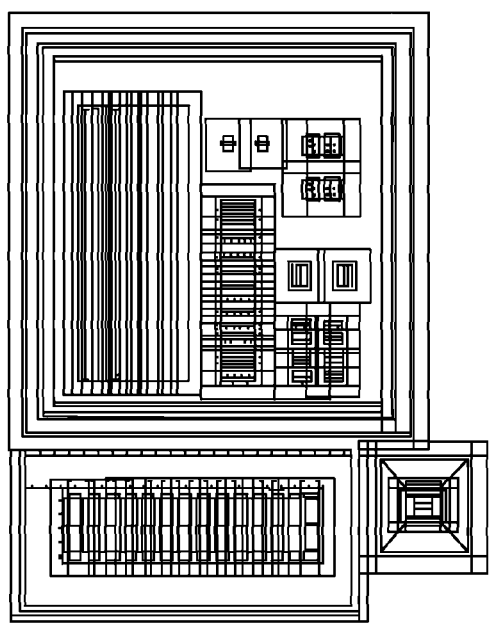

An exemplary layout of the proposed logic comparator and a layout of the comparator of FIG. 5 are depicted in FIGS. 20a and 20b, respectively. The silicon area saving of proposed solution is evident, even if in the layout of FIG. 20a the allocation of the used electronic components was not optimized and the so-called well pockets generation was not minimized.

Figure 21:
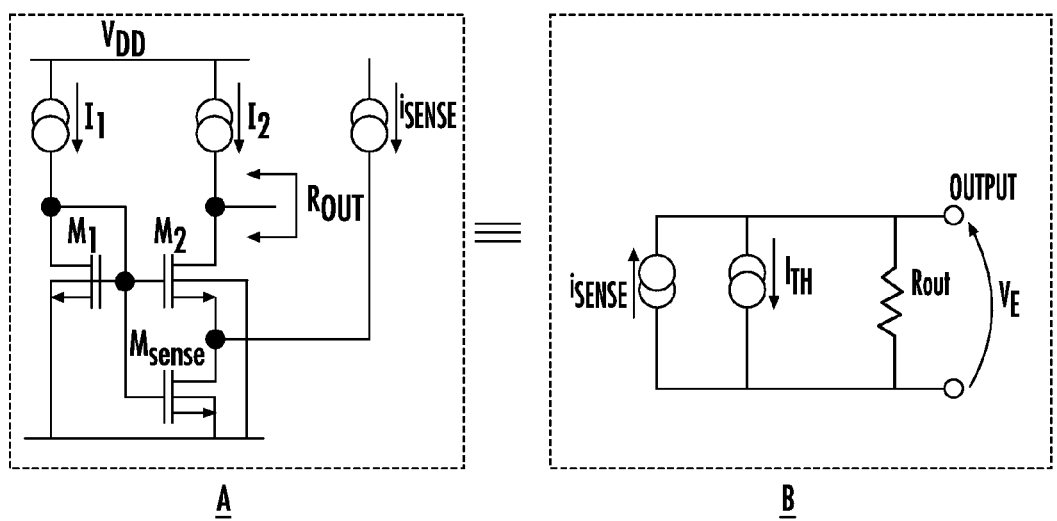
FIG. 21 depicts a basic architecture of the circuit of the present invention and the equivalent circuit for small signals.

As stated hereinbefore, the proposed circuit of FIG. 6 may be used for monitoring the value of the sensed current Isense when it exceeds the threshold current $I_{TH}$. In order to illustrate the functioning of the circuit in such a working condition, reference is made to FIGS. 21a and 21b, that depict the proposed circuit and its equivalent circuit for small signals, respectively.

Rout is the equivalent resistance "seen" from the node OUTPUT and the ground node, and the difference Vε between the present voltage $V_{OUTPUT}$ and its value corresponding to the functioning condition in which the sensed current Isense equals the threshold current $I_{TH}$, is given by the following equation:

$$V\epsilon = (i_{SENSE} - I_{TH}) \cdot Rout$$

Figure 22:
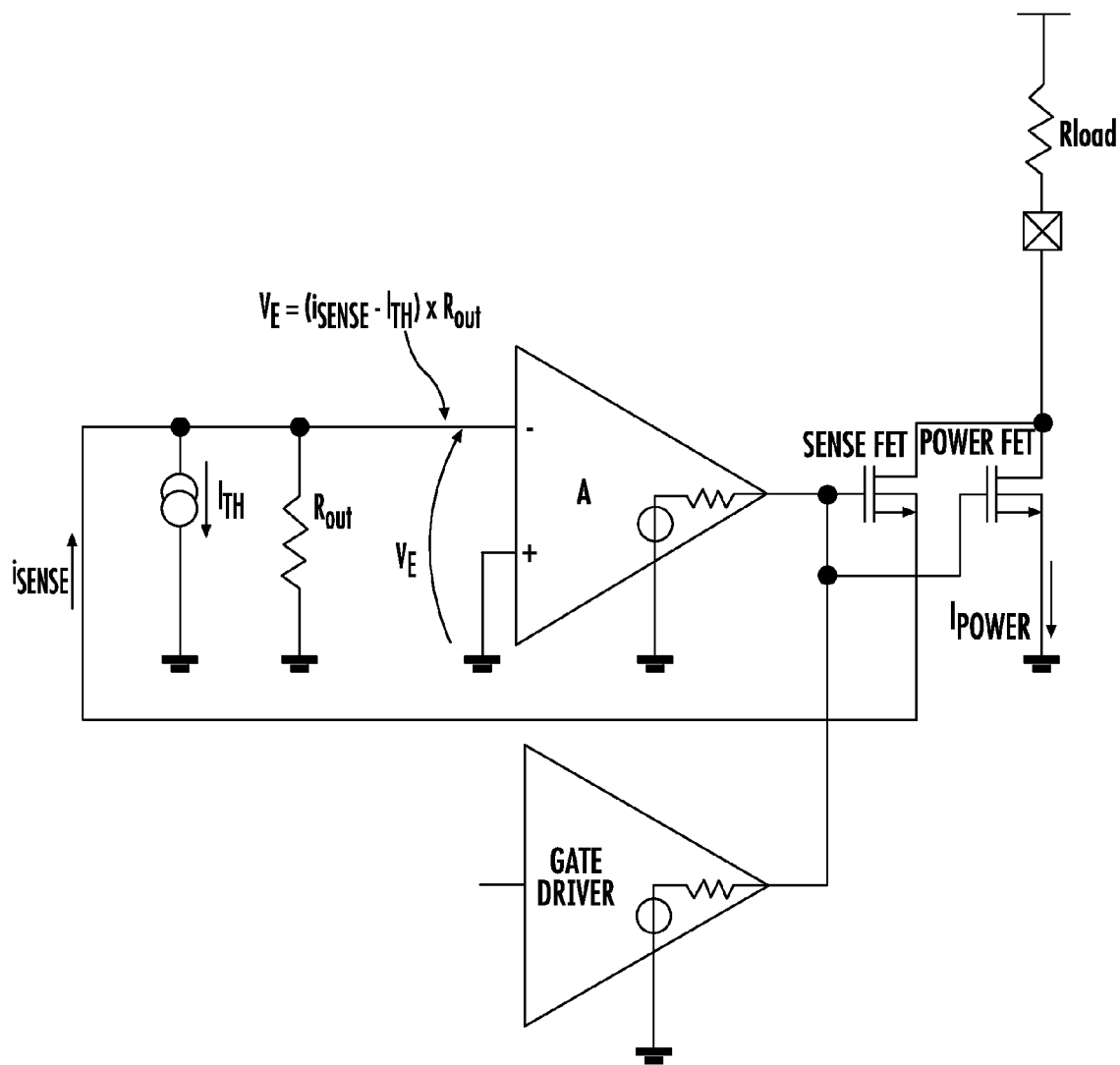
FIG. 22 depicts a feedback loop for controlling the drive voltage of the PowerFet that includes the circuit of FIG. 21.

The difference Vε may be used as an error signal in a feedback control loop, a basic architecture of which is depicted in FIG. 22, for controlling the drive voltage of the PowerFet. The voltage Vε is amplified by an amplifier A, that adjusts the voltage generated by a driver stage GATE DRIVER of the PowerFet.

Figure 23:
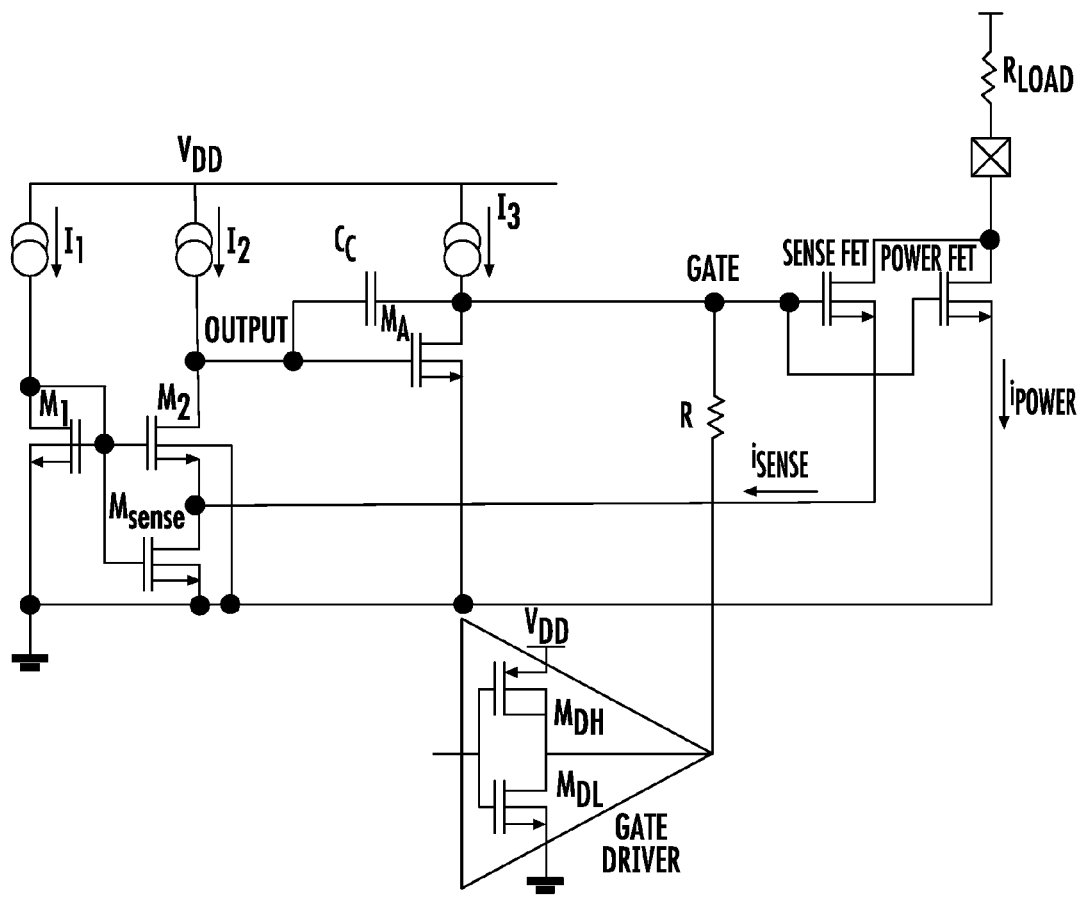
FIG. 23 is a detailed view of an exemplary architecture of the circuit of FIG. 22.

A preferred embodiment of a feedback control loop is depicted in FIG. 23. The amplifier is a common source stage composed of a transistor $M_A$ that is off when the voltage $V_{OUTPUT}$ corresponds to a current Isense smaller than the threshold $I_{TH}$, and that operates in a saturation condition when Isense attains or exceeds the threshold $I_{TH}$. The current generator I3 biases the transistor M4 in a saturation condition as soon as the voltage $V_{OUTPUT}$ corresponds to the value for which Isense=$I_{TH}$.

The resistor R is preferably determined such to make the voltage drop I3*(R+$R_{DL}$), being $R_{DL}$ the resistance of the switch $M_{DL}$, smaller than the threshold voltage of the PowerFet, otherwise the PowerFet would be kept on. The capacitor Cc is not essential, though it is preferably used for making more stable the feedback loop.

An exemplary drive stage of the PowerFet may be the depicted half-bridge stage, the output terminal of which is coupled to the gate of the PowerFet through a bias resistor R.

Figure 24:
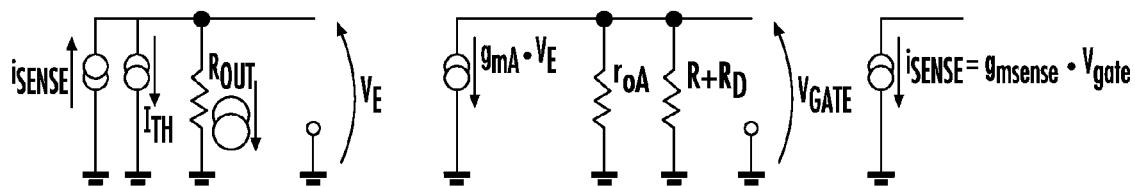
FIG. 24 is an equivalent circuit for small signals of the circuit of FIG. 23.

The equivalent circuit for small signals of the feedback control loop of FIG. 23 is depicted in FIG. 24, wherein $R_D$ is the resistance of the upper or the lower switch $M_{DH}$, $M_{DL}$ of the half bridge stage, $g_{msense}$ and $g_{mA}$ are the transconductance of the SenseFet and of the transistor $M_A$, respectively. The loop gain $G_{LOOP}$ is:

$$G_{LOOP} = g_{mA} \cdot (r_{oA} \| (R_{DH} + R)) \cdot g_{msense} \cdot R_{OUT}$$

Figure 25:
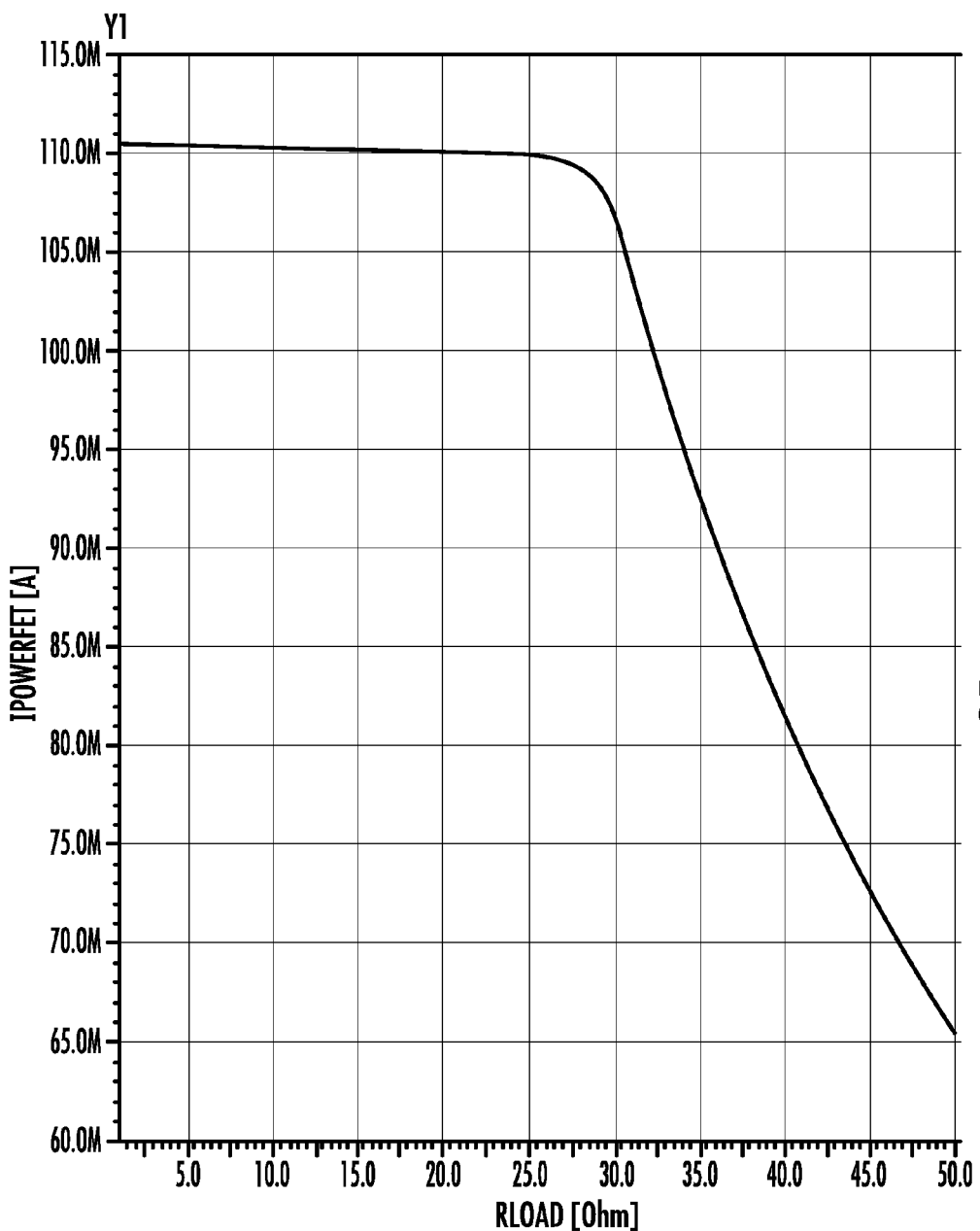
FIG. 25 is a graph of the current $I_{POWER}$ flowing through the PowerFet in function of the load resistance Rload, according to the present invention.
Figure 26:
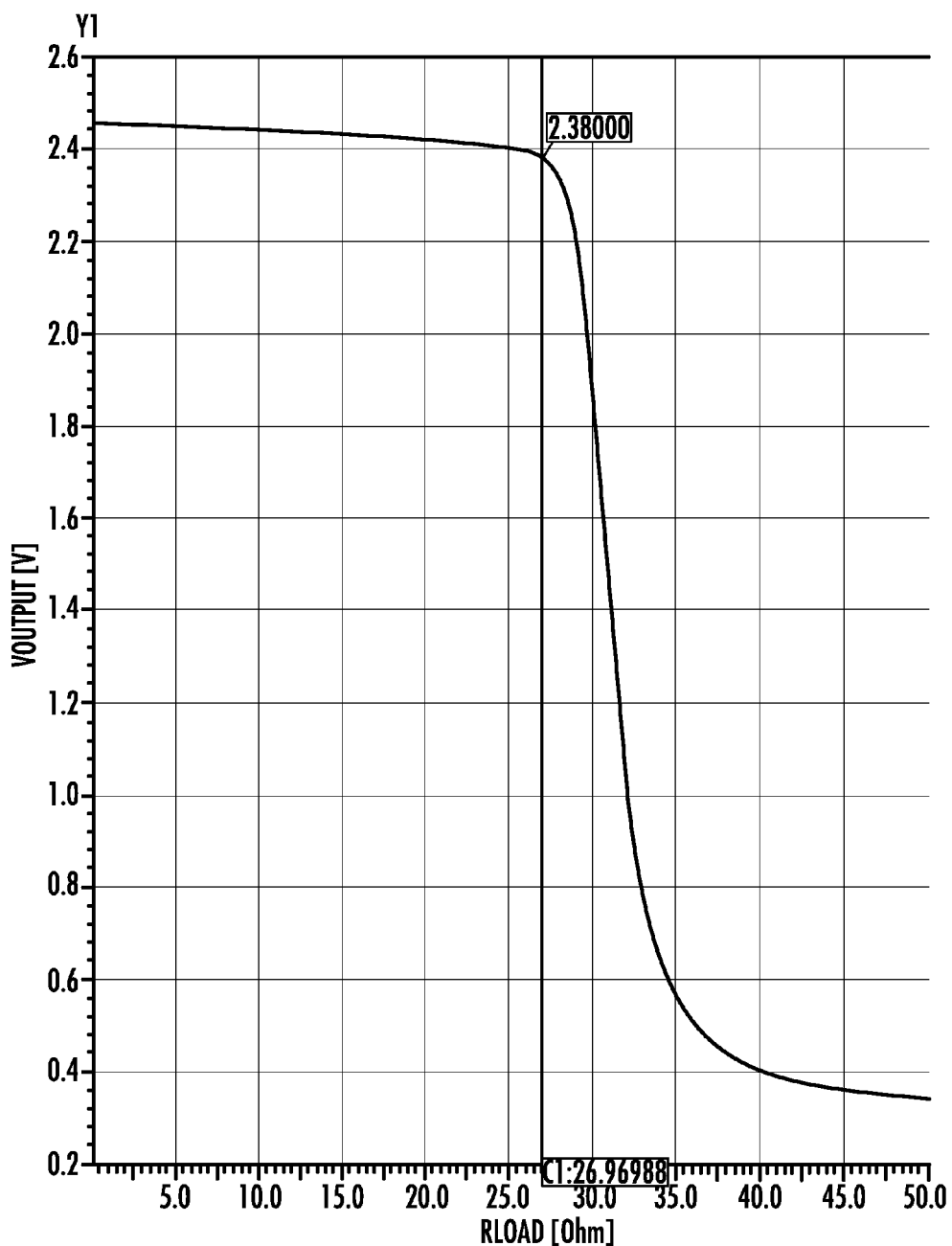
FIG. 26 is a graph of the drive voltage $V_{OUTPUT}$ of the transistor $M_A$ in function of the load resistance Rload, according to the present invention.
Figure 27:
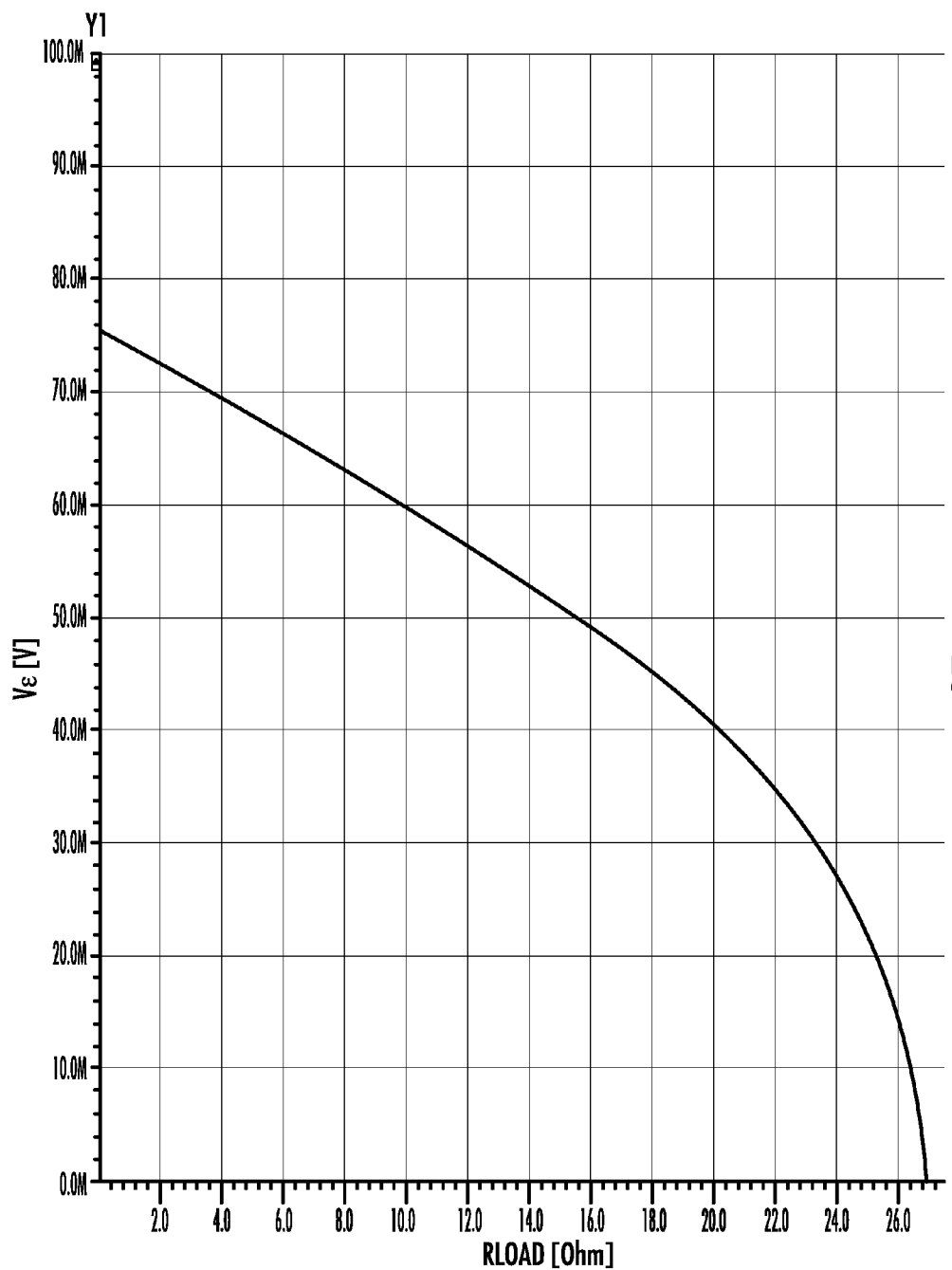
FIG. 27 is a graph of the difference Vε between the drive voltage $V_{OUTPUT}$ of the transistor $M_A$ and the respective voltage corresponding to the threshold current $I_{TH}$ in function of the load resistance Rload, according to the present invention.

The functioning of the circuit of FIG. 23 has been simulated for various values of the load Rload using typical test values for the fabrication parameters of the components of the circuit. The exemplary graphs of FIGS. 25 to 27 have been obtained. In the graph of FIG. 26 the vertical line represents the value of the load Rload for which the sensed current Isense attains the threshold $I_{TH}$. For larger load resistances the sensed current Isense is smaller than the threshold $I_{TH}$, for smaller load resistances the sensed current is larger than the threshold $I_{TH}$.

The above-mentioned figures demonstrate that the voltage $V_{OUTPUT}$ rises abruptly when the sensed current Isense becomes greater than the threshold $I_{TH}$, and remains substantially constant even if the resistive load further decreases after the current Isense has attained the threshold $I_{TH}$. The variations of the voltage $V_{OUTPUT}$ for small values of the load resistance are due to the fact that the loop gain is not infinite.

Even if the depicted exemplary circuits use only MOS transistors, the same circuit architectures may be realized also with BJTs.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. An electronic device comprising:
   a circuit for comparing an input current to a current threshold comprising
   a diode-connected transistor having a control terminal and to be biased with a first constant current and function in a saturation condition,
   a sense transistor having a control terminal and a conduction terminal and being mirrored to said diode-connected transistor and to be biased to function in a linear condition, and
   a load transistor having a control terminal, first and second conduction terminals, and to be coupled in series with said sense transistor and to be biased with a second constant current,
   said control terminals of said diode-connected transistor, said sense transistor, and said load transistor being directly coupled together,
   said first conduction terminal of said load transistor and said conduction terminal of said sense transistor to receive the input current so that an output voltage is available on said second conduction terminal of said load transistor with the output voltage representing a difference between the input current and the current threshold when the input current is larger than the current threshold.

2. The electronic device of claim 1, further comprising a logic comparator coupled to said second conduction terminal of said load transistor and configured to generate a logic flag when the output voltage exceeds a threshold voltage.

3. The electronic device of claim 1, wherein said diode-connected transistor, said sense transistor, and said load transistor each comprises a low-voltage MOS transistors.

4. The electronic device of claim 2, further comprising:
a high voltage current sense transistor to generate the input current;
a first high voltage transistor to be biased with the first constant current and coupled in series with said diode-connected transistor;
a second high voltage transistor controlled by said logic comparator and to be biased with a third constant current; and
a low voltage logic comparator coupled to said second high voltage transistor and the third constant current and outputting a low voltage replica of the output voltage.

5. The electronic device of claim 1, further comprising:
an amplifier having an input coupled to said second conduction terminal of said load transistor and having a turn-on threshold corresponding to a voltage at said second conduction terminal of said load transistor when the input current is equal to the current threshold;
said amplifier configured to generate an amplified replica of a difference between a present voltage at said second conduction terminal of said load transistor and the turn-on threshold.

6. The electronic device of claim 5, further comprising a node and a constant current generator for generating a third constant current coupled thereto; wherein said amplifier comprises an amplification transistor having the turn-on threshold, to be controlled by a voltage at said second conduction terminal of said load transistor, and to be biased by the third constant current; and wherein said amplification transistor is for generating the representative voltage at the node.

7. The electronic device of claim 6, wherein said amplification transistor has a control terminal; and further comprising a capacitor coupled between said control terminal of said amplification transistor and the node.

8. The electronic device of claim 5 further comprising a transistor having a control terminal; further comprising a drive stage having an input and an output and for generating, at the output thereof, a drive voltage of the transistor based upon a reference input signal; a resistor coupling the output of said drive stage to the control terminal of said transistor; wherein said transistor is for generating, at the output thereof, the input current; and wherein the output of said transistor is coupled to said control terminal thereof.

9. An electronic device comprising:
a circuit for comparing an input current to a current threshold comprising
a diode-connected transistor having a control terminal and to be biased with a first constant current and function in a saturation condition,
a sense transistor having a control terminal and a conduction terminal and being mirrored to said diode-connected transistor and to be biased to function in a linear condition,
a load transistor having a control terminal, first and second conduction terminals, and to be coupled in series with said sense transistor and to be biased with a second constant current,
said control terminals of said diode-connected transistor, said sense transistor, and said load transistor being directly coupled together,
said first conduction terminal of said load transistor and said conduction terminal of said sense transistor to receive the input current so that an output voltage is available on said second conduction terminal of said load transistor with the output voltage representing a difference between the input current and the current threshold when the input current is larger than the current threshold, and
a logic comparator coupled to said second conduction terminal of said load transistor and configured to generate a logic flag when the output voltage exceeds a threshold voltage,
said diode-connected transistor, said sense transistor, and said load transistor each comprising a low-voltage MOS transistor.

10. The electronic device of claim 9, further comprising:
an amplifier having an input coupled to said second conduction terminal of said load transistor and having a turn-on threshold corresponding to a voltage at said second conduction terminal of said load transistor when the input current is equal to the current threshold;
said amplifier configured to generate an amplified replica of a difference between a present voltage at said second conduction terminal of said load transistor and the turn-on threshold.

11. The electronic device of claim 10, further comprising a node and a constant current generator for generating a third constant current coupled thereto; wherein said amplifier comprises an amplification transistor having the turn-on threshold, to be controlled by a voltage at said second conduction terminal of said load transistor, and to be biased by the third constant current; and wherein said amplification transistor is for generating the representative voltage at the node.

12. A method of making a circuit for comparing an input current to a current threshold comprising:
configuring a diode-connected transistor to be biased with a first constant current and function in a saturation condition;
configuring a sense transistor to be mirrored to the diode-connected transistor and to be biased to function in a linear condition;
coupling a load transistor in series with the sense transistor and configuring it to be biased with a second constant current;
directly coupling control terminals of the diode-connected transistor, the sense transistor, and the load transistor together; and
configuring the first conduction terminal of the load transistor and the conduction terminal of the sense transistor to receive the input current so that an output voltage is available on the second conduction terminal of the load transistor with the output voltage representing a difference between the input current and the current threshold when the input current is larger than the current threshold.

13. The method of claim 1, further comprising coupling a logic comparator to said second conduction terminal of said load transistor and configuring it to generate a logic flag when the output voltage exceeds a threshold voltage.

14. The method of claim 1, wherein said diode-connected transistor, said sense transistor, and said load transistor each comprises a low-voltage MOS transistors.

15. The method of claim 13, further comprising:
- configuring a high voltage current sense transistor to generate the input current;
- coupling a first high voltage transistor in series with the diode-connector transistor and configuring it to be biased with the first constant current;
- configuring a second high voltage transistor to be controlled by said logic comparator and to be biased with a third constant current; and
- coupling a low voltage logic comparator to said second high voltage transistor and the third constant current and configuring it to output a low voltage replica of the output voltage.

16. The method of claim 12, further comprising:
- coupling an input of an amplifier, having a turn-on threshold corresponding to a voltage at said second conduction terminal of said load transistor when the input current is equal to the current threshold, to said second conduction terminal of said load transistor and; and
- configuring said amplifier to generate an amplified replica of a difference between a present voltage at said second conduction terminal of said load transistor and the turn-on threshold.

17. The method of claim 16, further comprising: coupling a constant current generator for generating a third constant current to a node; wherein said amplifier comprises an amplification transistor having the turn-on threshold, to be controlled by a voltage at said second conduction terminal of said load transistor, and to be biased by the third constant current; and wherein said amplification transistor is for generating the representative voltage at the node.

18. The method of claim 17, further comprising coupling a capacitor between a control terminal of said amplification transistor and the node.

\* \* \* \* \*